US011231467B2

(12) United States Patent
Du et al.

(10) Patent No.: US 11,231,467 B2
(45) Date of Patent: Jan. 25, 2022

(54) METHOD, DEVICE, AND SYSTEM, FOR STATE OF CHARGE (SOC) CORRECTION FOR A BATTERY (71) Applicant: Contemporary Amperex Technology Co., Limited, Ningde (CN)

(72) Inventors: Mingshu Du, Fujian (CN); Shichao Li, Fujian (CN); Shenzhi Tang, Fujian (CN); Jian Ruan, Fujian (CN); Yanhua Lu, Fujian (CN); Wei Zhang, Fujian (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 75 days.

(21) Appl. No.: 16/854,147

(22) Filed: Apr. 21, 2020

(65) Prior Publication Data
US 2020/0400750 A1    Dec. 24, 2020

(30) Foreign Application Priority Data

Jun. 24, 2019   (CN) .......................... 201910547687.3

(51) Int. Cl.
*G01R 31/3835* (2019.01)
*H02J 7/00* (2006.01)
(Continued)

(52) U.S. Cl.
CPC ..... *G01R 31/3835* (2019.01); *G01R 31/3648* (2013.01); *H01M 10/44* (2013.01); *H01M 10/48* (2013.01); *H02J 7/0048* (2020.01)

(58) Field of Classification Search
CPC .............. G01R 31/382; G01R 31/3835; G01R 31/3648; H02J 7/0048; H01M 10/44; H01M 10/48
(Continued)

(56) References Cited

U.S. PATENT DOCUMENTS 10,073,147 B2 *  9/2018  Hongo ................ G01R 31/367
2006/0202663 A1  9/2006  Cho et al.
(Continued)

FOREIGN PATENT DOCUMENTS

CN     101946187 A    1/2011
CN     101946187 B    6/2013
(Continued)

OTHER PUBLICATIONS

The extended European search report for EP Application No. 20174496.8, dated Sep. 2, 2020, 10 pages.
(Continued)

*Primary Examiner* — Nathaniel R Pelton
(74) *Attorney, Agent, or Firm* — Law Offices of Liaoteng Wang (57) ABSTRACT

The present disclosure provides a method, a device, a system, and a storage medium for SOC correction for a battery. The method includes determining a current OCV measurement value of the battery, and determining whether the current OCV measurement value is within a hysteresis voltage interval; determining, when the current OCV measurement value is within the hysteresis voltage interval, a charging SOC value corresponding to the current OCV measurement value in the charging state and a discharging SOC value corresponding to the current OCV measurement value in the discharging state; and determining, based on a SOC confidence interval determined from the charging SOC value and the discharging SOC value, a SOC correction target value to correct a current SOC value of the battery. The embodiments of the present disclosure may implement SOC correction for the battery having a hysteresis characteristic to improve estimation accuracy of the battery SOC.

9 Claims, 3 Drawing Sheets (51) Int. Cl.
*G01R 31/36* (2020.01)
*H01M 10/44* (2006.01)
*H01M 10/48* (2006.01)

(58) Field of Classification Search
USPC ............................................ 320/132
See application file for complete search history.

(56) References Cited

U.S. PATENT DOCUMENTS

| | | | |
|---|---|---|---|
| 2009/0210179 A1* | 8/2009 | Tang | H01M 10/48 702/63 |
| 2014/0172333 A1 | 6/2014 | Gopalakrishnan et al. | |
| 2017/0010327 A1* | 1/2017 | Nishiguchi | G01R 31/392 |
| 2019/0178948 A1 | 6/2019 | Takahashi | |

FOREIGN PATENT DOCUMENTS

| | | |
|---|---|---|
| CN | 103616646 A | 3/2014 |
| CN | 104714182 A | 6/2015 |
| CN | 105190338 A | 12/2015 |
| CN | 105203963 A | 12/2015 |
| CN | 106802394 A | 6/2017 |
| CN | 107368619 A | 11/2017 |
| CN | 105203963 B | 12/2017 |
| CN | 108226809 A | 6/2018 |
| CN | 110988720 A | 4/2020 |
| JP | 2018185259 A | 11/2018 |
| JP | 2018185260 A | 11/2018 |
| WO | WO2013133113 A1 | 9/2013 |
| WO | WO2013136559 A1 | 9/2013 |
| WO | WO2014045706 A1 | 3/2014 |
| WO | WO2014132491 a1 | 9/2014 |
| WO | WO2018181620 A1 | 10/2018 |
| WO | 110967636 A1 | 4/2020 |

OTHER PUBLICATIONS

The International search report for PCT Application No. PCT/CN2020/084708, dated Jul. 16, 2020, 14 pages.
The First Office Action for China Application No. 201910547687.3, dated Jul. 21, 2020, 11 pages.
Hui Bao et al., "State of Charge Estimation Error Correction of Open Circuit Voltage Method", Journal of Civil Aviation Flight University of China, vol. 25. No. 5, dated Dec. 31, 2014, 4 pages.
The First Office Action for Japanese Application No.2020-560456, dated Nov. 24, 2021, 10 pages.

* cited by examiner

METHOD, DEVICE, AND SYSTEM, FOR STATE OF CHARGE (SOC) CORRECTION FOR A BATTERY

CROSS REFERENCE TO RELATED APPLICATION

The present application is based upon and claims the benefits of Chinese Patent Application No. 201910547687.3 filed on Jun. 24, 2019, the entire contents of which are incorporated herein by reference.

FIELD

The present disclosure generally relates to batteries, and more particularly to a method, a device, a system and a storage medium for state of charge (SOC) correction for a battery.

BACKGROUND

In a battery management system of an electric vehicle, SOC of a battery is used to reflect the remaining capacity of the battery. Moreover, the SOC is also an important parameter for battery capabilities such as equalization control technology, rapid charge and discharge management, safe operation and the like. Therefore, accurate SOC estimation plays an important role in power indication, remaining mileage, over-charge and over-discharge protection, battery balance, charge control and battery health prediction by the battery management system.

At present, a common SOC correction method such as an open circuit voltage (OCV) method may obtain the SOC of the battery in a static state by using a correspondence between an OCV and an SOC. However, for a battery having a hysteresis characteristic, an OCV curve characterizing the correspondence between the OCV and the SOC may be affected by historical operating conditions. Change of the OCV curve may cause a great error of the OCV method, which may reduce the accuracy of SOC correction.

SUMMARY

Embodiments of the present disclosure provide a method, a device, a system, and a storage medium for SOC correction for a battery, which may correct a SOC of a battery having a hysteresis characteristic, and improve accuracy of estimating the SOC of the battery.

In an aspect, the embodiments of the present disclosure provides a SOC correction method for a battery, including: determining a current open-circuit voltage (OCV) measurement value of the battery, and determining whether the current OCV measurement value is within a hysteresis voltage interval, wherein an OCV measurement value within the hysteresis voltage interval satisfies: when a SOC value of the battery in a charging state is equal to a SOC value of the battery in a discharging state, an OCV value corresponding to the SOC value of the battery in the charging state is different from an OCV value corresponding to the SOC value of the battery in the discharging state; determining, when the current OCV measurement value is within the hysteresis voltage interval, a charging SOC value corresponding to the current OCV measurement value in the charging state and a discharging SOC value corresponding to the current OCV measurement value in the discharging state; and determining, based on a SOC confidence interval determined from the charging SOC value and the discharging SOC value, a SOC correction target value to correct a current SOC value of the battery.

In another aspect, the embodiments of the present disclosure provides a SOC correction device for a battery, including: a voltage measurement value determination module configured to determine a current open-circuit voltage (OCV) measurement value of the battery, and determine whether the current OCV measurement value is within a hysteresis voltage interval, wherein an OCV measurement value within the hysteresis voltage interval satisfies: when a SOC value of the battery in a charging state is equal to a SOC value of the battery in a discharging state, an OCV value corresponding to the SOC value of the battery in the charging state is different from an OCV value corresponding to the SOC value of the battery in the discharging state; a SOC determination module configured to determine, when the current OCV measurement value is within the hysteresis voltage interval, a charging SOC value corresponding to the current OCV measurement value in the charging state and a discharging SOC value corresponding to the current OCV measurement value in the discharging state; and a SOC correction module configured to determine, based on a SOC confidence interval determined from the charging SOC value and the discharging SOC value, a SOC correction target value to correct a current SOC value of the battery.

In yet another aspect, the embodiments of the present disclosure provides a SOC correction system for a battery, including: a memory and a processor, wherein: the memory is configured to store executable program codes; and the processor is configured to read the executable program codes stored in the memory to perform the above SOC correction method for a battery.

In still another aspect, the embodiments of the present disclosure provides a computer readable storage medium including instructions which, when executed on a computer, cause the computer to perform the above SOC correction method for a battery.

In the method, device, system and storage medium for SOC correction for a battery according to the embodiments of the present disclosure, influence of the hysteresis characteristic on the SOC of the battery is considered. If the OCV measurement value of the battery is within the hysteresis voltage range, the SOC correction target value may be determined using the charging SOC value corresponding to the current OCV measurement value in the charging state and the discharging SOC value corresponding to the current OCV measurement value in the discharging state, so as to correct the current SOC value. Compared with SOC estimation directly using the OCV value, the SOC correction method of the embodiments of the present disclosure can obtain a more accurate SOC of the battery.

BRIEF DESCRIPTION OF THE DRAWINGS

In order to more clearly illustrate technical solutions of the embodiments of the present disclosure, drawings used in the embodiments of the present disclosure will be briefly described below. For those skilled in the art, other drawings may be obtained from these figures without any creative work.

DETAILED DESCRIPTION

Features and exemplary embodiments in various aspects of the present disclosure will be described in detail. The present disclosure will be further described in detail below with reference to the accompanying drawings and embodiments, to make the purposes, the technical solutions, and the advantages clearer. It is understood that the specific embodiments described herein are only to be construed as illustrative and not limiting. The present disclosure may be practiced without some of the details of these specific details, as would be understood by the skilled in the art. The following description of the embodiments is merely intended to provide a better understanding of the disclosure by illustration of examples of the present disclosure.

It should be noted that, in this context, relationship terms such as first and second are used merely to distinguish one entity or operation from another entity or operation, and do not necessarily require or imply that there is any such an actual relationship or order between such entities or operations. Furthermore, the term "comprise" or "include" or any other variations thereof is intended to encompass a non-exclusive inclusion, such that a process, method, article, or device that comprises a plurality of elements includes not only those elements but also other elements that are not listed exactly, or elements that are inherent to such a process, method, article, or device. An element that is defined by the phrase "comprising", without limiting the disclosure, does not exclude the presence of additional elements in the process, method, article, or device.

The battery in an embodiment of the present disclosure may be a battery in which energy-carrying particles can be received or emitted at both the positive electrode and the negative electrode, which is not limited herein. In terms of type of the battery, the battery may be, but not limited to, a lithium iron phosphate battery or a silicon-added battery. The lithium iron phosphate battery is a lithium ion battery with lithium iron phosphate contained in active material at the positive electrode, and the silicon-added battery is a lithium ion battery with silicon contained in active material at the negative electrode. In terms of scale of the battery, the battery may be a battery cell or a battery module or a battery pack, which is not specifically limited in the embodiments of the present disclosure.

In an embodiment of the present disclosure, due to difference in charging characteristics and discharging characteristics of the battery, the hysteresis characteristic refers to a phenomenon where the OCV after charging and the OCV after discharging are different under the same SOC, after the battery is charged and discharged at the same current. This phenomenon is called the hysteresis characteristic of the battery. Therefore, the hysteresis characteristic can describe the characteristic that the OCV curve of the battery is affected by the historical operating condition. It is necessary to consider the influence of the hysteresis characteristic on the SOC of the battery when using the OCV to estimate the SOC of the battery.

In an embodiment, the OCV curve is used to describe the correspondence between the OCV and the SOC of the battery. The OCV curve may include a charging OCV curve and a discharging OCV curve. The charging OCV curve may be used to describe the correspondence between the OCV and the SOC of the battery in a charging state, and the discharging OCV curve may be used to describe the correspondence between the OCV and the SOC of the battery in a discharging state.

In the common SOC estimation method, such as the OCV method, the OCV curve of the battery is not affected by the historical operating condition, that is, the OCV of the battery is only related to the current temperature and SOC, so that the SOC may be obtained after the battery is in a static state. However, for a battery having the hysteresis characteristic, the variation of the OCV curve may cause a large error in the OCV method, which reduces the applicability of the OCV method.

In an embodiment of the present disclosure, the current SOC value to be corrected may be calculated by a SOC calculation device using a preset SOC calculation method. Therefore, the SOC calculation method is not limited in the embodiments of the present disclosure.

In order to better understand the present disclosure, a SOC correction method for a battery according to an embodiment of the present disclosure will be described in detail below with reference to the accompanying drawings. It should be noted that these embodiments are not intended to limit the scope of the present disclosure.

Embodiments of the present disclosure provide a method, a system, a device, and a computer readable storage medium for SOC correction for a battery, which may correct the SOC of a battery having a hysteresis characteristic and improve the estimation accuracy of the SOC of the battery.

Figure 1:
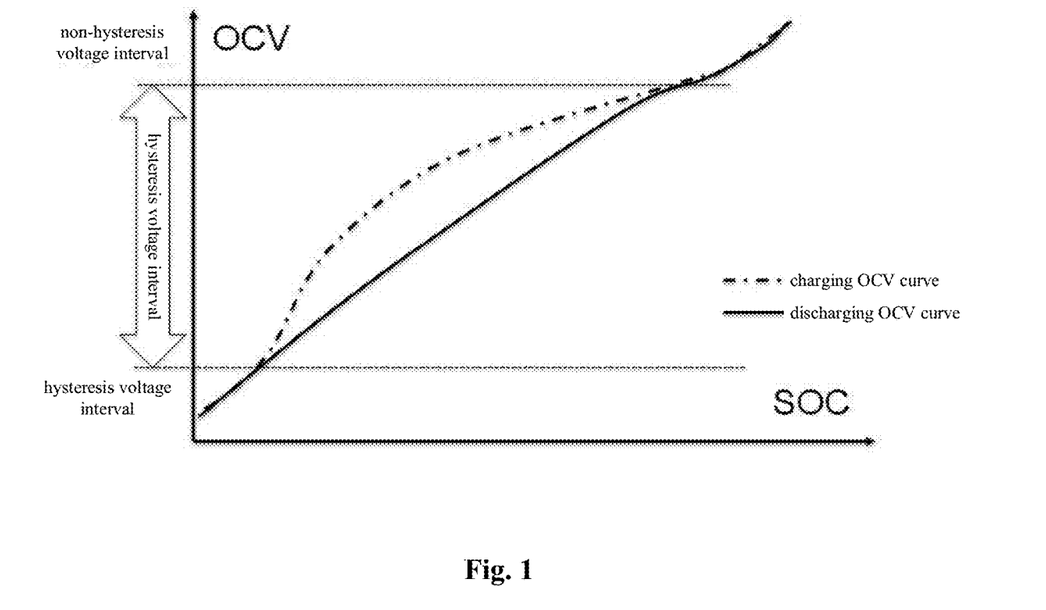
FIG. 1 is a schematic curve showing an OCV hysteresis characteristic of a battery.

FIG. 1 is a schematic curve showing an OCV hysteresis characteristic of a battery. As shown in FIG. 1, the OCV interval of the battery may be divided into a hysteresis voltage interval and a non-hysteresis voltage interval according to the difference between the charging OCV curve and the discharging OCV curve. In the hysteresis voltage interval, the charging OCV curve and the discharging OCV curve do not coincide, and in the non-hysteresis voltage interval, the charging OCV curve and the discharging OCV curve coincide. Therefore, in the following description of the embodiment, the coincided portion of the charging OCV curve and the discharging OCV curve within the non-hysteresis voltage interval may be referred to as a non-hysteresis OCV-SOC curve.

In other words, the non-hysteresis OCV-SOC curve is used to describe the correspondence between the OCV and the SOC of the battery within the non-hysteresis voltage range in the charging state, and the correspondence between the OCV and the SOC of the battery within the non-hysteresis voltage range in the discharging state.

Figure 2:
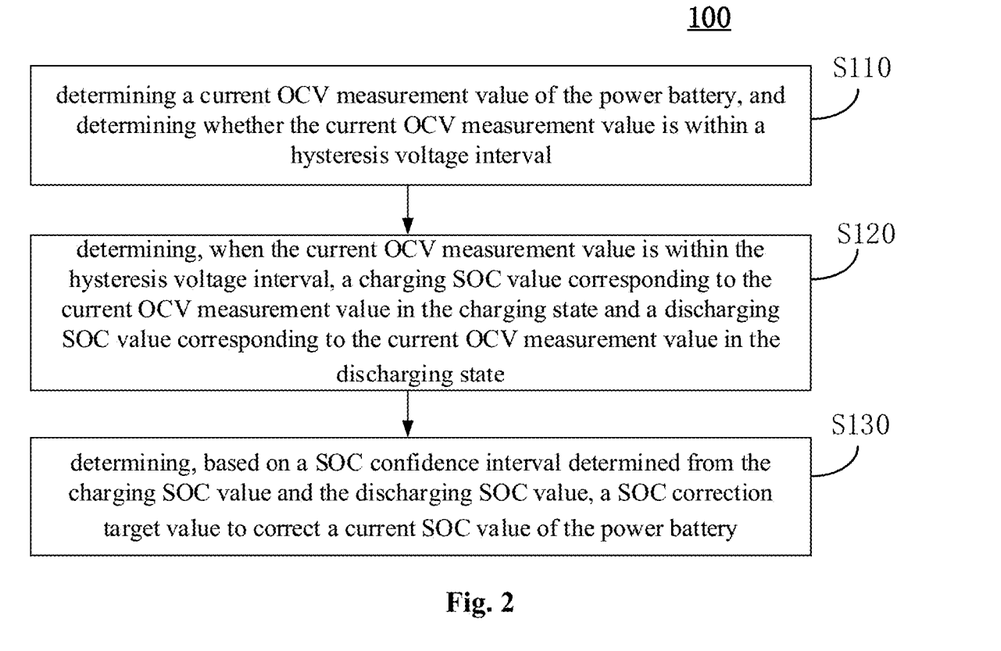
FIG. 2 is a flow chart showing a SOC correction method for a battery according to an embodiment of the present disclosure.

FIG. 2 is a flow chart showing a SOC correction method for a battery according to an embodiment of the present disclosure. As shown in FIG. 2, in an embodiment, the SOC correction method 100 may include step S110 where a current OCV measurement value of the battery is determined, and whether the current OCV measurement value is within the hysteresis voltage interval is determined.

An OCV measurement value within the hysteresis voltage interval satisfies: when a SOC value of the battery in the charging state is equal to a SOC value of the battery in the discharging state, an OCV value corresponding to the SOC value of the battery in the charging state is different from an OCV value corresponding to the SOC value of the battery in the discharging state.

In an embodiment, an OCV measurement value within the non-hysteresis voltage interval satisfies: when the SOC value of the battery in the charging state is equal to the SOC value of the battery in the discharging state, the OCV value corresponding to the SOC value of the battery in the charging state is equal to the OCV value corresponding to the SOC value of the battery in the discharging state.

The SOC correction method 100 may include step S120 where a charging SOC value corresponding to the current OCV measurement value in the charging state and a discharging SOC value corresponding to the current OCV measurement value in the discharging state are determined when the current OCV measurement value is within the hysteresis voltage interval.

The SOC correction method 100 may include step S130 where a SOC correction target value is determined based on a SOC confidence interval determined from the charging SOC value and the discharging SOC value, to correct a current SOC value of the battery.

In the SOC correction method for a battery according to the embodiments of the present disclosure, the SOC correction target value may be determined using the charging SOC value corresponding to the current OCV measurement value in the charging state and the discharging SOC value corresponding to the current OCV measurement value in the discharging state when the OCV measurement value of the battery is within the hysteresis voltage interval, so as to correct the current SOC value. As a result, a more accurate SOC of the battery can be obtained.

In an embodiment, determining the current OCV measurement value of the battery in step S110 may include: determining, based on a rest period and a temperature distribution during rest of the battery, whether the battery satisfies a sufficient rest condition, and recording, when the battery satisfies the sufficient rest condition, the current voltage value of the battery as the current OCV measurement value of the battery.

As an example, for the battery to satisfy the sufficient rest condition, when the minimum rest temperature is 25 degrees Celsius, the lower limit of the rest period may be, for example, 1 hour, that is, the rest period is 1 hour or more; when the minimum rest temperature is 0 degrees Celsius, the lower limit of the rest period may be, for example, 2 hours; when the minimum rest temperature is −20 degrees Celsius, the lower limit of the rest period may be, for example, 3 hours.

In an embodiment of the present specification, the rest period and the temperature distribution during rest of the battery may be determined by experimental values of an offline calibration and/or empirical values in actual working conditions. It should be noted that there are differences in battery system and the like between batteries, and the sufficient rest condition of different batteries are different. The above embodiments are not intended to limit the scope of the disclosure.

In an embodiment, the voltage range of the OCV of the battery may be divided into the hysteresis voltage interval and the non-hysteresis voltage interval. The hysteresis voltage interval and the non-hysteresis voltage interval of the battery may be determined through an experimental test, so as to determine whether the current OCV measurement value is within the hysteresis voltage interval or the non-hysteresis voltage interval by inquiring the voltage value within the hysteresis voltage interval and the voltage value within the non-hysteresis voltage interval.

In an embodiment, when the current OCV measurement value is within the non-hysteresis voltage interval outside the hysteresis voltage interval, the SOC correction target value may be determined based on the charging SOC value corresponding to the current OCV measurement value in the charging state or the discharging SOC value corresponding to the current OCV measurement value in the discharging state, so as to correct the current SOC value.

In other words, for the current OCV measurement value within the non-hysteresis voltage interval, the charging OCV curve and the discharging OCV curve coincide. Thus, the correspondence between the OCV and the SOC in the charging state described by the charging OCV curve may be used to determine the charging SOC value corresponding to the current OCV measurement value in the charging state as the SOC correction target value. Or the correspondence between the OCV and the SOC in the discharging state described by the discharging OCV curve may be used to determine the discharging SOC value corresponding to the current OCV measurement value in the discharging state as the SOC correction target value.

In this embodiment, if the current OCV measurement value is within the non-hysteresis voltage interval, the non-hysteresis OCV-SOC curve and the current OCV measurement value may be used to determine the SOC correction target value, such as SOC0, and the current SOC value is corrected to SOC0.

In an embodiment, when the current SOC value is less than a lower boundary value of the SOC confidence interval, the SOC correction target value is the lower boundary value; and when the current SOC value is greater than an upper boundary value of the SOC confidence interval, the SOC correction target value is the upper boundary value.

The lower boundary value is a smaller one of the charging SOC value and the discharging SOC value, and the upper boundary value is a greater one of the charging SOC value and the discharging SOC value.

In this embodiment, the SOC value corresponding to the current OCV measurement value in the charging OCV curve, for example, SOC1, and the SOC value corresponding to the current OCV measurement value in the discharging OCV curve, for example, SOC2, may determine a confidence interval of the current SOC value. If SOC1 is smaller than SOC2, the confidence interval of the current SOC value can be expressed as [SOC1, SOC2]. If the current SOC value is less than SOC1, the current SOC value is corrected to SOC1. If the current SOC state is greater than SOC2, the current SOC value is corrected to SOC2. That is to say, if the current SOC value exceeds the SOC confidence interval, the current SOC value is corrected to a closer boundary value of the confidence interval.

In an embodiment, when the current SOC value is greater than the lower boundary value of the SOC confidence interval and less than the upper boundary value of the SOC confidence interval, the SOC correction target value is determined to be the current SOC value.

In this embodiment, if the current SOC value does not exceed the SOC confidence interval, the SOC correction target value is determined to be the current SOC value, that is, the current SOC value does not need to be corrected.

According to the SOC correction method of the embodiments of the present disclosure, it may be determined whether the current OCV is within the non-hysteresis voltage interval or the hysteresis voltage interval, and then different SOC correction schemes are provided respectively for the hysteresis OCV interval and the non-hysteresis OCV interval. As a result, the correction accuracy of the SOC of the battery is effectively improved.

Specific flow of SOC correction based on the OCV estimation model in accordance with the embodiments of the present disclosure will be described below with reference to the accompanying drawings. In an embodiment, the current SOC value, such as SOCr, may be calculated in real time, and the pre-recorded SOC values corresponding to the latest N changes in current direction with respect the current SOC value may be obtained. The SOC values corresponding to the latest N changes in current direction are used as historical SOC values, then the historical SOC values [SOC1, SOC2, SOCN] and the current SOC value SOCr together constitute a list of a SOC change path. For example, it can be expressed as: [SOC1, SOC2, SOCN, SOCr].

In this embodiment, the recorded list of the SOC change path is taken as an input, and the current estimated OCV value is output through the OCV estimation model that has been calibrated. For ease of understanding, a hysteresis model component, a Preisach model, for example, will be used as the OCV estimation model to describe specific details in processing of the SOC change path by the OCV estimation model to obtain the current estimated OCV value below in conjunction with the drawings.

Figure 3:
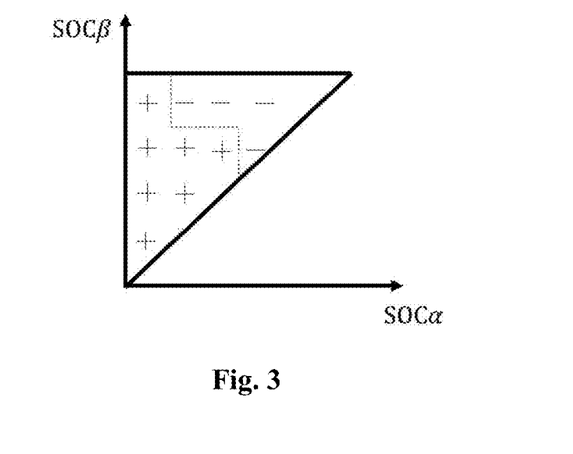
FIG. 3 is a schematic diagram showing a mesh-triangle of a Preisach model according to an embodiment of the present disclosure.
Figure 4:
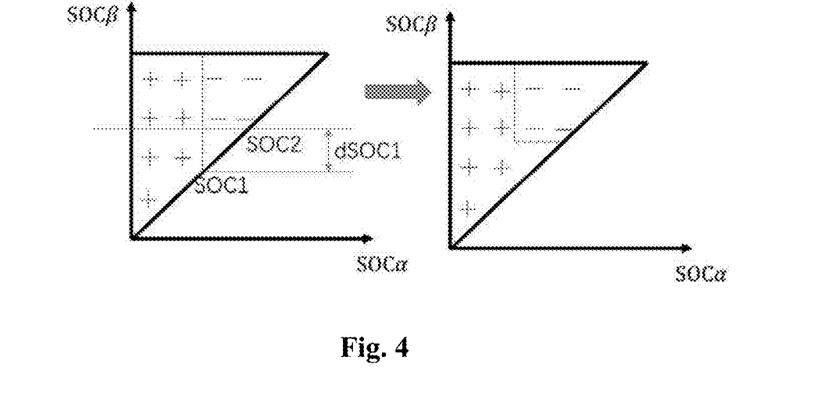
FIG. 4 is a schematic diagram showing a training flow of a Preisach model according to an embodiment of the present disclosure.
Figure 5:
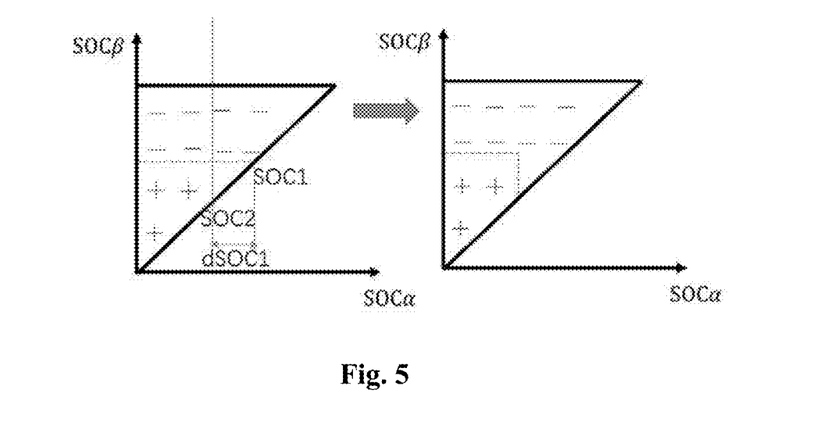
FIG. 5 is a schematic diagram showing a training flow of a Preisach model according to another embodiment of the present disclosure.

FIG. 3 is a schematic diagram showing a mesh-triangle of a Preisach model according to an embodiment of the present disclosure. FIG. 4 is a schematic diagram showing a training flow of a Preisach model according to an embodiment of the present disclosure. FIG. 5 is a schematic diagram showing a training flow of a Preisach model according to another embodiment of the present disclosure.

As shown in FIG. 3, SOCα (X-axis) and SOCβ (Y-axis) may form a Preisach triangle (the isosceles right-angled triangle portion composed of thick solid lines in the upper left corner), and the Preisach triangle is discretized, for example, along the X-axis direction and the Y-axis direction to form a plurality of rectangular grids, for example, a mesh-triangle composed of L×L square grids.

In an embodiment, the Preisach model is constructed by superposition of hysteresis operators γ_αβ (i). All Preisach operators (α, β) form a right-angled triangle in a two-dimensional plane. Historical information of the hysteresis characteristic may be represented by a memory curve in the triangle. The memory curve is a stepped curve (the dotted line in the figure).

Assuming that the initial value of the SOC at the start of recording is SOC0, the SOC0 is used as a starting point on the hypotenuse of the Preisach triangle, that is, the coordinate point (SOC0, SOC0) is used as the starting point. Based on each change in the current direction and the SOC variation corresponding to the each change in current direction in the SOC change path, when the battery is determined to be charged, the stepped curve is reflected as a line that rises horizontally within the triangle according to the charged amount of SOC; and when the battery is determined to be discharged, the stepped curve is reflected as a line vertically shifted to the left within the triangle according to the discharged amount of SOC. The hysteresis operator boundary may be determined by the above historical charge and discharge process of the battery.

When the rechargeable battery starts to be charged and is charged with dSOC0, a line is made parallel to the X-axis and passing through the point SOC0, and the line is shifted upward by a distance dSOC0, resulting in a hysteresis operator boundary. When the battery starts to be discharged and is discharged with dSOC0, a line is made parallel to the Y-axis and passing through the point SOC0, and the line is shifted to the left by the distance dSOC0, resulting in a hysteresis operator boundary.

As shown in FIG. 4, the point (SOC1, SOC1) at which the hysteresis operator boundary intersects with the hypotenuse of the Preisach triangle is used as a starting point. When charging continues and the battery is charged with dSOC1, a line is made parallel to the X-axis and passing through the point SOC1, and the line is shifted upward by a distance dSOC1. As a result, and broken line formed by this line and the original hysteresis operator boundary is the hysteresis operator boundary.

As shown in FIG. 5, when the discharging continues and the battery is discharged with dSOC1, a line is made parallel to the Y-axis and passing through the point SOC1, and the line is shifted to the left by a distance dSOC1. As a result, and broken line formed by this line and the original hysteresis operator boundary is the hysteresis operator boundary.

In turn, the hysteresis operator boundary is updated each time the battery is charged or discharged. After determining the hysteresis operator boundary, the hysteresis operator γ_αβ (i) corresponding to the grids in the upper right corner of the hysteresis operator boundary of the Preisach triangle is denoted as −1, and the hysteresis operator γ_αβ (i) of remaining part of the grids are marked as +1.

In an embodiment of the present disclosure, the process of determining the hysteresis operator boundary of the Preisach model is the process of updating the hysteresis operator. The hysteresis operator of the Preisach model is updated in accordance with each change in current direction and the SOC variation corresponding to each change in current direction in the SOC change path.

Through the updated hysteresis operator of Preisach model, the Preisach model may be expressed as the following expression (1):

$$\omega_{OCV}(t) = \sum_{i=1}^{N} \mu_{\alpha\beta}(i) \cdot \gamma_{\alpha\beta}(i) \tag{1}$$

In the above expression (1), $\omega_{OCV}(t)$ represents the output of the Preisach model, that is, an OCV weight factor, N represents the number of grids of the Preisach triangular, and $\mu_{\alpha\beta}(i)$ represents the hysteresis operator corresponding to the i-th grid, $\gamma_{\alpha\beta}(i)$ represents the weight factor corresponding to the hysteresis operator $\mu_{\alpha\beta}(i)$. The weight factor of the hysteresis operator in the embodiments of the present disclosure may be pre-calibrated by a specific charging and discharging process.

When determining the OCV weight factor $\omega_{OCV}(t)$, the current estimated OCV value may be calculated by the following expression (2):

$$OCV(t) = (1+\omega_{OCV}(t))/2 \cdot OCV1(t) + (1-\omega_{OCV}(t))/2 \cdot OCV2(t) \tag{2}$$

In the above expression (2), OCV1(t) represents an OCV value determined based on the current SOC value and the charging OCV curve, OCV2(t) represents an OCV value determined based on the current SOC value and the discharging OCV curve. The current estimated OCV value is obtained by merging OCV1(t) and OCV2(t) using the OCV weight factor $\omega_{OCV}(t)$.

In an embodiment, the above step S130 may include step S131 where the SOC change path formed by the current SOC value and the historical SOC value(s) is determined, and the current estimated OCV value is obtained based on processing of the SOC change path by an OCV estimation model component.

In an embodiment, the historical SOC value(s) may include: sequentially pre-recorded N SOC values of the battery corresponding to N changes in current direction, and the Nth SOC value is a SOC value corresponding to a previous change occurs in current direction with respect to the current SOC value, where N is greater than or equal to 1.

In an embodiment, the SOC change path may include: each of historical SOC values acquired in sequence based on recording time, and the current SOC value.

The step S130 may include step S132 where an SOC correction variation for each correction is determined based on the SOC confidence interval and a preset error-range-equal-division parameter, when an absolute value of a voltage difference between the current estimated OCV value and the current OCV measurement value is greater than or equal to a voltage difference threshold.

In an embodiment, the current SOC value is not corrected when the absolute value of the voltage difference between the current estimated OCV value and the current OCV measurement value is less than the voltage difference threshold. That is, the SOC correction target value is the current SOC value.

In this step, a difference between the lower boundary value of the SOC confidence interval and the current SOC value is determined as a lower boundary value of an error range for the current SOC value; a difference between the upper boundary value of the SOC confidence interval and the current SOC value is determined as a upper boundary value of the error range for the current SOC value; and the error range for the current SOC value determined by the lower boundary value and the upper boundary value of the error range for the current SOC value is equally divided using the preset error-range-equal-division parameter, so that a upper limit for number of corrections corresponding to the error range for the current SOC value and the SOC correction variation for each correction can be obtained.

As an example, the preset error-range-equal-division parameter is k, and k is an integer greater than 1. As can be seen from the description of the above embodiments, the SOC value corresponding to the current OCV measurement value in the charging OCV curve, for example, SOC1, and the SOC value corresponding to the current OCV measurement value in the discharging OCV curve, for example, SOC2, may form a confidence interval [SOC1, SOC2] for the current SOC value. The error range for the current SOC value SOCr may be expressed as [SOC1-SOCr, SOC2-SOCr]. The error range for the current SOC value may be equally divided into k parts based on the error-range-equal-division parameter k, to obtain an error list consisting of k SOC error variations: [dSOC[1], dSOC[2], dSOC[3], ..., dSOC[k]], where dSOC[i] in the error list indicates the SOC correction variation for the i-th correction, i is an integer greater than or equal to 1 and less than or equal to k, and the upper limit for the number of corrections may be equal to the total number of the SOC correction variations obtained.

The step S130 may include step S133 where the current SOC value is corrected based on the SOC correction variation and a sign of the voltage difference to obtain a corrected value of the current SOC value.

In this step, when the absolute value of the voltage difference between the current estimated OCV value and the current OCV measurement value is greater than or equal to the voltage difference threshold, the corrected value of the current SOC value may be calculated by the following expression (3):

$$SOCre[i]=SOCr+dSOC[i]\times sign(OCVe-OCVm) \quad (3)$$

In the above expression (3), i is an integer greater than or equal to 1 and less than or equal to k, dSOC[i] is the SOC correction variation for the i-th correction to the current SOC value, and SOCre[i] is the corrected value of the SOC value obtained after the i-th correction. When the voltage difference between the estimated OCV value OCVe and the current OCV measurement value OCVm is positive, sign (OCVe-OCVm) takes a value of 1, thus the corrected value of the current SOC value is a SOC sum of the current SOC value and the SOC correction variation. When the voltage difference between the estimated OCV value OCVe and the current OCV measurement value OCVm is negative, sign (OCVe-OCVm) takes a value of -1, thus the corrected value of the current SOC value is a SOC difference between the current SOC value and the SOC correction variation.

The step S130 may include step S134 where a new SOC change path formed by the corrected value of the current SOC value and the historical SOC value(s) is determined and the corrected value of the current SOC value is determined as the SOC correction target value until the absolute value of the voltage difference is less than the voltage difference threshold.

In this step, a new SOC change path [SOC1, SOC2, ... SOCN, SOCre[i]] composed of SOCre[i] obtained after the i-th correction and the historical SOC change path with N SOC values is taken as an input of the Preisach OCV estimation model to re-estimate the current OCV value. If the absolute value of the voltage difference between the current re-estimated OCV value and the current OCV measurement value is less than the voltage difference threshold, the corrected value of the current SOC value is output. If the absolute value of the voltage difference between the current re-estimated OCV value and the current OCV measurement value is greater than or equal to the voltage difference threshold, the (i+1)th correction is performed on the current SOC value. It is set that i=i+1, and the above steps S132 and S133 are repeated to recalculate the corrected value of the current SOC value.

In this step, the corrected value of the current SOC value is output when the number of corrections for the current SOC value reaches the upper limit for the number of corrections.

In this embodiment, the SOC value can be corrected through estimation of the OCV by the OCV estimation model component in conjunction with the difference between the current OCV measurement value and the current estimated OCV value determined by the OCV estimation model component.

Based on the content described in the above embodiments, in an embodiment, in the step S131, the obtaining of the current estimated OCV value based on processing of the SOC change path by the OCV estimation model component may include:

step S1311 where a first OCV value corresponding to the current SOC value is determined based on the current SOC state and a correspondence between the SOC of the battery in the charging state and the OCV;

step S1312 where a second OCV value corresponding to the current SOC value is determined based on the current SOC state and a correspondence between the SOC of the battery in the discharging state and the OCV; and step S1313 where an OCV weight factor is determined based on the processing of the SOC change path by the OCV estimation model component, and the first OCV value and the second OCV value is merged using the OCV weight factor to obtain the current estimated OCV value.

In an embodiment, in step S1313, the determining of the OCV weight factor based on the processing of the SOC change path by the OCV estimation model component may include:

step S1313-01 where each change in current direction and a SOC variation corresponding to each change in current direction are sequentially determined based on a sequence of recording time of the SOC values in the SOC change path;

step S1313-02 where an initial value of a hysteresis operator is determined based on the first change in current direction and a SOC variation corresponding to the first change in current direction;

step S1313-03 where the hysteresis operator is updated based on a change(s) in current direction other than the first change and a SOC variation(s) corresponding to the change(s) in current direction other than the first change; and step S1313-04 where the updated hysteresis operator(s) is merged using the pre-calibrated weight factor(s) of the hysteresis operator to obtain the OCV weight factor.

In an embodiment, the hysteresis operator in the OCV estimation model may reflect historical operating conditions, such as the change in current direction and corresponding SOC variation in the historical SOC change path. The OCV estimation model component may reflect the correspondence between the OCV and the SOC with hysteresis characteristics. Therefore, using the OCV estimation model component, the historical SOC change path corresponding to the current SOC value is determined as the input of the OCV estimation model component, and the OCV estimation model is used to estimate the OCV in real time, so as to correct the SCO value in turn. As a result, correction accuracy of the SOC value corresponding to the OCV within the hysteresis voltage interval can be improved.

Figure 6:
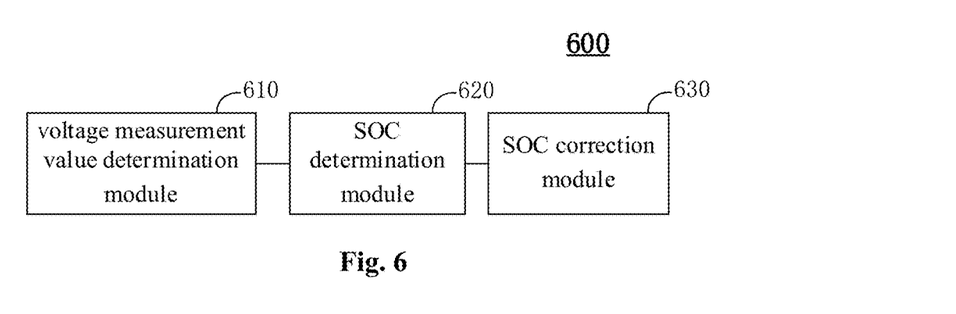
FIG. 6 is a schematic structure diagram of a SOC correction device for a battery according to an embodiment of the disclosure.

Below, a SOC correction device for a battery according to an embodiment of the present disclosure will be described in detail with reference to the accompanying drawings. FIG. 6 is a schematic structure diagram of a SOC correction device for a battery according to an embodiment of the disclosure. As shown in FIG. 6, the SOC correction device for a battery 600 may include a voltage measurement value determination module 610, a SOC determination module 620, and a SOC correction module 630.

The voltage measurement value determination module 610 may be configured to determine a current OCV measurement value of the battery, and determine whether the current OCV measurement value is within a hysteresis voltage interval.

An OCV measurement value within the hysteresis voltage interval satisfies: when a SOC value of the battery in the charging state is equal to a SOC value of the battery in the discharging state, an OCV value corresponding to the SOC value of the battery in the charging state is different from an OCV value corresponding to the SOC value of the battery in the discharging state.

The SOC determination module 620 may be configured to determine, when the current OCV measurement value is within the hysteresis voltage interval, the charging SOC value corresponding to the current OCV measurement value in the charging state and the discharging SOC value corresponding to the current OCV measurement value in the discharging state.

The SOC correction module 630 may be configured to determine, based on the SOC confidence interval determined from the charging SOC value and the discharging SOC value, the SOC correction target value to correct the current SOC value of the battery.

In an embodiment, the SOC correction module 630 may also be configured to determine, when the current OCV measurement value is within the non-hysteresis voltage interval outside the hysteresis voltage interval, the SOC correction target value based on the charging SOC value or the discharging SOC value, so as to correct the current SOC value.

In an embodiment, the SOC correction module 630 may also be configured to determine the SOC correction target value to be the current SOC value when the current SOC value is greater than the lower boundary value of the SOC confidence interval and less than the upper boundary value of the SOC confidence interval.

In an embodiment, when the current SOC value is less than the lower boundary value of the SOC confidence interval, the SOC correction target value is the lower boundary value of the SOC confidence interval; and when the current SOC value is greater than the upper boundary value of the SOC confidence interval, the SOC correction target value is the upper boundary value of the SOC confidence interval. The lower boundary value is the smaller one of the charging SOC value and the discharging SOC value, and the upper boundary value is the greater one of the charging SOC value and the discharging SOC value.

In an embodiment, the SOC correction module 630 may include an estimated-OCV-value determination unit, a SOC correction variation determination unit, a SOC correction value determination unit, and a SOC correction target value determination unit.

The estimated-OCV-value determination unit may be configured to determine a SOC change path formed by the current SOC value and the pre-recorded historical SOC value(s), and obtain the current estimated OCV value based on the processing of the SOC change path by the OCV estimation model component.

The SOC correction variation determination unit may be configured to determine the SOC correction variation for each correction based on the SOC confidence interval and the preset error-range-equal-division parameter, when the absolute value of the voltage difference between the current estimated OCV value and the current OCV measurement value is greater than or equal to the voltage difference threshold.

The SOC correction value determination unit may be configured to correct the current SOC value based on the SOC correction variation and the sign of the voltage difference to obtain a corrected value of the current SOC value.

The SOC correction target value determination unit may be configured to determine a new SOC change path formed by the corrected value of the current SOC value and the historical SOC value(s) and determine the corrected value of the current SOC value as the SOC correction target value until the absolute value of the voltage difference is less than the voltage difference threshold.

In an embodiment, the estimated-OCV-value determination unit may be specifically configured to: determine, based on the current SOC value and a correspondence between the SOC of the battery in the charging state and the OCV, a first OCV value corresponding to the current SOC value; determine, based on the current SOC value and a correspondence between the SOC of the battery in the discharging state and the OCV, a second OCV value corresponding to the current SOC value; and determine, based on the processing of the SOC change path by the OCV estimation model component, an OCV weight factor, and merge the first OCV value and the second OCV value using the OCV weight factor to obtain the current estimated OCV value.

In an embodiment, the historical SOC value(s) may include: sequentially pre-recorded N SOC values of the battery corresponding to N changes in current direction, and the Nth SOC value is a SOC value corresponding to a previous change occurs in current direction with respect to the current SOC value, where N is greater than or equal to 1. The SOC change path may include: each of historical SOC values acquired in sequence based on recording time, and the current SOC value.

In an embodiment, the estimated-OCV-value determination unit may be configured, when configured to determine the OCV weight factor based on the processing of the SOC change path by the OCV estimation model component, to: determine sequentially each change in current direction and a SOC variation corresponding to each change in current direction based on a sequence of recording time of the SOC values in the SOC change path; determine an initial value of the hysteresis operator based on the first change in current direction and a SOC variation corresponding to the first change in current direction; update the hysteresis operator based on a change(s) in current direction other than the first change and a SOC variation(s) corresponding to the change(s) in current direction other than the first change; and merge the updated hysteresis operator(s) using the pre-calibrated weight factor(s) of the hysteresis operator to obtain the OCV weight factor.

In an embodiment, the SOC correction variation determination unit may be configured, when configured to determine the SOC correction variation based on the SOC confidence interval and the preset error-range-equal-division parameter, to: determine the difference between the lower boundary value of the SOC confidence interval and the current SOC value as the lower boundary value of the error range for the current SOC value; determine the difference between the upper boundary value of the SOC confidence interval and the current SOC value as the upper boundary value of the error range for the current SOC value; and equally divide the error range for the current SOC value determined by the lower boundary value and the upper boundary value of the error range for the current SOC value using the preset error-range-equal-division parameter to obtain the SOC correction variation.

According to the SOC correction device of the embodiments of the present disclosure, the SOC of the battery having hysteresis characteristics may be corrected based on historical operating conditions within the hysteresis voltage interval. As a result, the accuracy of estimation of the SOC of the battery can be improved.

It is to be understood that the disclosure is not limited to the specific configurations and processes described in the above embodiments and illustrated in the drawings. For the convenience and brevity of the description, a detailed description of a known method is omitted here. For the specific operating process of the system, the module, and the unit described above, reference may be made to the corresponding process in the above method embodiments, and details are not described herein again.

Figure 7:
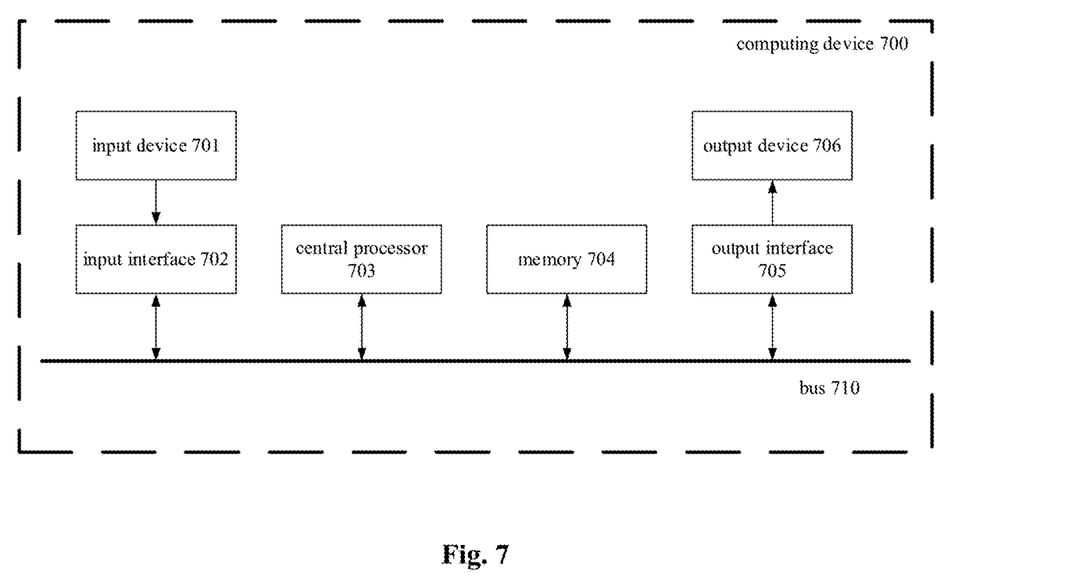
FIG. 7 is a structure diagram showing an exemplary hardware architecture of a computing device that can implement a method and a device for SOC correction in accordance with an embodiment of the present disclosure.

FIG. 7 is a structure diagram showing an exemplary hardware architecture of a computing device that can implement a method and a device for SOC correction in accordance with an embodiment of the present disclosure.

As shown in FIG. 7, a computing device 700 includes an input device 701, an input interface 702, a central processor 703, a memory 704, an output interface 705, and an output device 706. The input interface 702, the central processing unit 703, the memory 704, and the output interface 705 are interconnected through a bus 710. The input device 701 and the output device 706 are connected to the bus 710 through the input interface 702 and the output interface 705, respectively, and connected to other components of the computing device 700. Specifically, the input device 701 receives input information from the outside and transmits the input information to the central processor 703 via the input interface 702. The central processor 703 processes the input information based on computer executable instructions stored in the memory 704 to generate an output information. The output information is temporarily or permanently stored in the memory 704, and the output information is then communicated to the output device 706 via the output interface 705. The output device 706 outputs the output information to the outside of computing device 700 for use by a user.

In an embodiment, the computing device 700 shown in FIG. 7 may be implemented as a SOC correction system for a battery. The SOC correction system for a battery may include: a memory configured to store a program; and a processor configured to execute the program stored in the memory to perform the SOC correction method for a battery described in the above embodiments.

According to the embodiments of the present disclosure, the process described above with reference to the flowcharts may be implemented as a computer software program. For example, an embodiment of the disclosure includes a computer program product comprising a computer program tangibly embodied on a machine readable medium. The computer program comprises program codes for performing the method illustrated in the flowcharts. In such an embodiment, the computer program may be downloaded and installed from the network, and/or installed from a removable storage medium.

The above embodiments may be implemented in whole or in part by software, hardware, firmware, or any combination thereof. When implemented in software, they may be implemented in whole or in part in the form of a computer program product. The computer program product may include one or more computer instructions that, when executed on a computer, cause the computer to perform the methods described in the various embodiments above. When computer program instructions are loaded and executed on a computer, the processes or functions described in accordance with embodiments of the present disclosure are generated in whole or in part. The computer may be a general purpose computer, a dedicated computer, a computer network, or other programmable device. The computer instructions may be stored in a computer readable storage medium or transferred from one computer readable storage medium to another computer readable storage medium. For example, the computer instructions may be communicated from a website site, computer, server or data center to another website site, computer, server, or data center via a wire (e.g., coaxial cable, optical fiber, digital subscriber line (DSL) or wireless means (e.g., infrared, wireless, microwave, etc.). The computer readable storage medium may be any available media that can be accessed by a computer or may be a data storage device such as a server, data center, or the like that includes one or more available media. The available medium may be a magnetic medium (e.g., a floppy disk, a hard disk, a magnetic tape), an optical medium (e.g., a DVD), or a semiconductor medium (e.g., a solid state hard disk), or the like.

The device embodiments described above are merely illustrative. The units described as separate components may or may not be physically separate, and the components displayed as units may or may not be physical units, i.e. may be located at a same place, or it may be distributed to multiple network units. Some or all of the modules may be selected according to actual needs to achieve the purpose of the solutions of the embodiments. Those of ordinary skill in the art may understand and implement the embodiments without creative labor.

Finally, it should be noted that the above embodiments are merely to illustrate the technical solutions of the present disclosure, and are not intended to be limiting. Although the present disclosure has been described in detail with reference to the above embodiments, those skilled in the art will understand that the technical solutions described in the above embodiments may be modified, or some or all of the technical features may be equivalently replaced, given that such modifications or substitutions do not depart from the scope of the embodiments of the present disclosure.

What is claimed is:

1. A state of charge (SOC) correction method for a battery, comprising:
    determining whether a current open-circuit voltage (OCV) measurement value of the battery is within a hysteresis voltage interval, wherein an OCV measurement value within the hysteresis voltage interval satisfies:
        when a SOC value of the battery in a charging state is equal to a SOC value of the battery in a discharging state, an OCV value corresponding to the SOC value of the battery in the charging state is different from an OCV value corresponding to the SOC value of the battery in the discharging state;
    determining, when the current OCV measurement value is within the hysteresis voltage interval, a charging SOC value corresponding to the current OCV measurement value in the charging state and a discharging SOC value corresponding to the current OCV measurement value in the discharging state; and
    determining, based on a SOC confidence interval determined from the charging SOC value and the discharging SOC value, a SOC correction target value to correct a current SOC value of the battery,
    wherein the SOC correction method is characterized in that the determining, based on a SOC confidence interval determined from the charging SOC value and the discharging SOC value, a SOC correction target value comprises:
    determining a SOC change path formed by the current SOC value and a historical SOC value, and obtaining a current estimated OCV value based on processing of the SOC change path by an OCV estimation model component;
    determining, based on the SOC confidence interval and a preset error-range-equal-division parameter k, a SOC correction variation for a SOC correction, when an absolute value of a voltage difference between the current estimated OCV value and the current OCV measurement value is greater than or equal to a voltage difference threshold;
    correcting, based on the SOC correction variation and a sign of the voltage difference, the current SOC value to obtain a corrected value of the current SOC value; and
    determining a new SOC change path formed by the corrected value of the current SOC value and the historical SOC value, and determining the corrected value of the current SOC value as the SOC correction target value until the absolute value of the voltage difference is less than the voltage difference threshold,
    wherein the preset error-range-equal-division parameter k is used for equally dividing an error range for the current SOC value into k parts to obtain an error list consisting of k SOC error variations: [dSOC[1], dSOC[2], dSOC[3], . . . , dSOC[k]], where dSOC[i] in the error list indicates a SOC correction variation for an i-th SOC correction, k is an integer greater than 1, and i is an integer greater than or equal to 1 and less than or equal to k.

2. The SOC correction method of claim 1, wherein the obtaining a current estimated OCV value based on processing of the SOC change path by an OCV estimation model component comprises:
    determining, based on the current SOC value and a correspondence between the SOC of the battery in the charging state and the OCV, a first OCV value corresponding to the current SOC value;
    determining, based on the current SOC value and a correspondence between the SOC of the battery in the discharging state and the OCV, a second OCV value corresponding to the current SOC value; and
    determining, based on the processing of the SOC change path by the OCV estimation model component, an OCV weight factor, and merging the first OCV value and the second OCV value using the OCV weight factor to obtain the current estimated OCV value.

3. The SOC correction method of claim 1, wherein
    the historical SOC value includes: sequentially pre-recorded N SOC values of the battery corresponding to N changes in current direction, wherein an Nth SOC value is a SOC value when a previous change occurs in current direction with respect to the current SOC value, wherein N is greater than or equal to 1; and
    the SOC change path includes: each of historical SOC values acquired in sequence based on recording time, and the current SOC value.

4. The SOC correction method of claim 2, wherein the determining, based on the processing of the SOC change path by the OCV estimation model component, an OCV weight factor comprises:
    determining, based on a sequence of recording time of the SOC values in the SOC change path, each change in current direction and a SOC variation corresponding to each change in current direction sequentially;
    determining, based on a first change in current direction and a SOC variation corresponding to the first change in current direction, an initial value of a hysteresis operator;
    updating, based on a change in current direction other than the first change and a SOC variation corresponding to the change in current direction other than the first change, the hysteresis operator; and
    merging, using a pre-calibrated weight factor of the hysteresis operator, the updated hysteresis operator to obtain the OCV weight factor.

5. The SOC correction method of claim 1, wherein the determining, based on the SOC confidence interval and a preset error-range-equal-division parameter k, a SOC correction variation for a SOC correction comprises:

determining a difference between a lower boundary value of the SOC confidence interval and the current SOC value as a lower boundary value of the error range for the current SOC value;

determining a difference between a upper boundary value of the SOC confidence interval and the current SOC value as a upper boundary value of the error range for the current SOC value; and equally dividing, using the preset error-range-equal-division parameter, the error range for the current SOC value determined by the lower boundary value and the upper boundary value of the error range for the current SOC value, to obtain the SOC correction variation for the SOC correction.

6. The SOC correction method of claim 1, further comprising:

determining, based on the charging SOC value or the discharging SOC value, the SOC correction target value to correct the current SOC value, when the current OCV measurement value is within a non-hysteresis voltage interval outside the hysteresis voltage interval.

7. A state of charge (SOC) correction device for a battery, comprising:

a voltage measurement value determination module configured to determine a current open-circuit voltage (OCV) measurement value of the battery, and determine whether the current OCV measurement value is within a hysteresis voltage interval, wherein an OCV measurement value within the hysteresis voltage interval satisfies:

when a SOC value of the battery in a charging state is equal to a SOC value of the battery in a discharging state, an OCV value corresponding to the SOC value of the battery in the charging state is different from an OCV value corresponding to the SOC value of the battery in the discharging state;

a SOC determination module configured to determine, when the current OCV measurement value is within the hysteresis voltage interval, a charging SOC value corresponding to the current OCV measurement value in the charging state and a discharging SOC value corresponding to the current OCV measurement value in the discharging state; and a SOC correction module configured to determine, based on a SOC confidence interval determined from the charging SOC value and the discharging SOC value, a SOC correction target value to correct a current SOC value of the battery, wherein the SOC correction device is characterized in that the SOC correction module is further configured to:

determine a SOC change path formed by the current SOC value and a historical SOC value, and obtain a current estimated OCV value based on processing of the SOC change path by an OCV estimation model component;

determine, based on the SOC confidence interval and a preset error-range-equal-division parameter k, a SOC correction variation for a SOC correction, when an absolute value of a voltage difference between the current estimated OCV value and the current OCV measurement value is greater than or equal to a voltage difference threshold;

correct, based on the SOC correction variation and a sign of the voltage difference, the current SOC value to obtain a corrected value of the current SOC value; and determine a new SOC change path formed by the corrected value of the current SOC value and the historical SOC value, and determine the corrected value of the current SOC value as the SOC correction target value until the absolute value of the voltage difference is less than the voltage difference threshold, wherein the preset error-range-equal-division parameter k is used for equally dividing an error range for the current SOC value into k parts to obtain an error list consisting of k SOC error variations: [dSOC[1], dSOC[2], dSOC[3], ..., dSOC[k]], where dSOC[i] in the error list indicates a SOC correction variation for an i-th SOC correction, k is an integer greater than 1, and i is an integer greater than or equal to 1 and less than or equal to k.

8. A state of charge (SOC) correction system for a battery, comprising: a memory and a processor, wherein:

the memory is configured to store executable program codes; and the processor is configured to read the executable program codes stored in the memory to perform the SOC correction method for a battery of any one of claims 1 to 6.

9. A computer readable storage medium comprising instructions which, when executed on a computer, cause the computer to perform the SOC correction method for a battery of any one of claims 1 to 6.

* * * * *